US006305964B1

United States Patent
Pon et al.

(10) Patent No.: US 6,305,964 B1
(45) Date of Patent: Oct. 23, 2001

(54) LOCKING DEVICE FOR LOCKING AN EDGE CARD TO AN ELECTRICAL CONNECTOR

(75) Inventors: Wenfu Pon, Tao-Yuan; Ming-Chun Lai, Shin-Juang, both of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/556,034

(22) Filed: Apr. 20, 2000

(30) Foreign Application Priority Data

Mar. 3, 2000 (TW) .............................................. 089203417

(51) Int. Cl.[7] .............................................. H01R 13/627
(52) U.S. Cl. .............................................. 439/327
(58) Field of Search ..................... 439/325–328

(56) References Cited

U.S. PATENT DOCUMENTS

| | | | |
|---|---|---|---|
| 5,584,705 | * 12/1996 | Lin | 439/157 |
| 5,943,218 | * 8/1999 | Liu | 439/327 |
| 6,007,357 | * 12/1999 | Perino et al. | 439/327 |
| 6,056,579 | * 5/2000 | Richards, III et al. | 439/327 |

\* cited by examiner

*Primary Examiner*—Gary F. Paumen
(74) *Attorney, Agent, or Firm*—Wei Te Chung

(57) ABSTRACT

A locking device for securing an edge card to an electrical connector comprises a U-shaped locking portion and a pair of second locking portions formed at either end of the electrical connector. The first locking portion includes a locking body and two clips perpendicularly extending from the locking body. A connecting portion between the locking body and corresponding clip forms a pair of ribs defining a receiving space therebetween. Each clip includes two resilient arms having two outwardly projecting barbs at a free end thereof. The second locking portions each comprises a U-shaped guiding channel extending upward from a top face of the electrical connector, and a pair of holes being defined on opposite sides of the connector housing below the guiding channel. The resilient arms are pressed oppositely so that they can be downwardly inserted into the guiding channel. Two upper corners of the edge card are securely received within the receiving space of the first locking portion.

1 Claim, 5 Drawing Sheets

LOCKING DEVICE FOR LOCKING AN EDGE CARD TO AN ELECTRICAL CONNECTOR

BACKGROUND OF THE INVENTION

The present invention relates to a locking device, and particularly to a locking device capable of securely locking an edge card to an electrical connector.

FIG. 5 shows an electrical connector 6 in accordance with U.S. Pat. No. 5,584,705 and an edge card 7. The electrical connector 6 comprises a locking device 5 positioned at each side thereof for securing the edge card 7 to the electrical connector 6. The locking device 5 includes a main body 50 and a clip 51 projecting from the main body 50 toward a middle portion of the connector 6. A lower end (not labeled) of the locking device 5 is pivotally secured within a recess 61 defined in a corresponding side of an insulative housing 60 of the electrical connector 6, thereby allowing the clip 51 to engage with a corresponding opening 70 defined in a side edge of the edge card 7. However, the locking device 5 is pivotally secured to the insulative housing 60, resulting in a difficult manufacture and assembly of the electrical connector 6.

Hence, an improved locking device for an electrical connector is required to overcome the disadvantages of the prior art.

BRIEF SUMMARY OF THE INVENTION

An object of the present invention is to provide a locking device for securing an edge card to an electrical connector wherein the locking device has a simple structure capable of decreasing the manufacturing and assembly costs.

To fulfill the above-mentioned objectives, a locking device for securing an edge card to an electrical connector in accordance with the present invention comprises a U shaped first locking portion and a pair of second locking portions formed at either side of the connector housing. The first locking portion includes a locking body and two clips perpendicularly extending from two distal ends of the locking body. A connecting portion between the locking body and a corresponding clip forms two parallel ribs defining a receiving space therebetween. Each clip downwardly extends from the locking body and includes two resilient arms at a lower end thereof. Each resilient arm further forms two outwardly projecting barbs at a free end thereof. The second locking portions include a pair of U-shaped guiding channels extending upwardly beyond a top face of the insulative housing. The second locking portions further include two pair of holes vertically oriented in opposite faces of and in both end of the insulative housing and beyond a top face of the insulative housing.

In use, the edge card is inserted into the electrical connector to reach a position in which the edge card is electrically engaged with terminals secured within the insulative housing and the resilient arms of the first locking portion are pressed together so that they can be downwardly inserted into the guiding channels of the second locking portions. Two upper corners of the edge card are securely received within the receiving spaces of the first locking portion. The resilient arms are released and respectively secured within the holes of the second locking portions, thereby firmly securing the edge card to the electrical connector.

Other objects, advantages and novel features of the invention will become more apparent from the following detailed description of the present embodiment when taken in conjunction with the accompanying drawings.

DETAILED DESCRIPTION OF THE INVENTION

Figure 1:
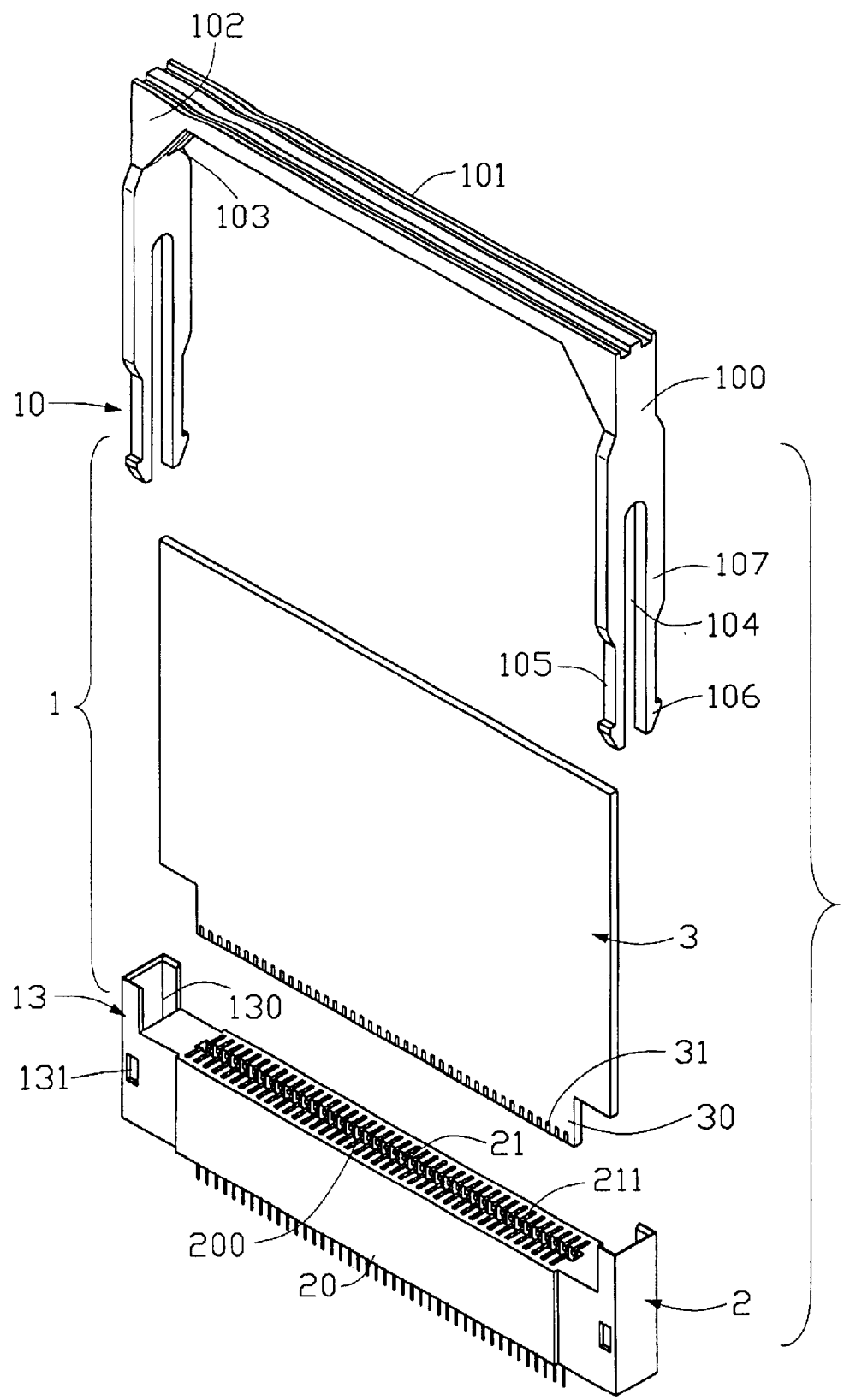
FIG. 1 is an exploded view of an electrical connector with a locking device in accordance with the present invention and an edge card to be fixedly mounted in the electrical connector by the locking device.

Referring to FIG. 1, an assembly of the present invention comprises an elongated electrical connector 2 defining a central receiving slot 200, an edge card 3 having a lower edge 30 for inserting into the receiving slot 200 and an upper edge and two side edges (not labeled), and a locking device 1 for engaging with the upper and side edges of the edge card 3 to secure the edge card 3 in the electrical connector 2. The locking device 1 comprises a first locking portion 10 and a pair of second locking portions 13 integral with the electrical connector 2.

The first locking portion 10 includes an elongated locking body 101 and two parallel clips 100 perpendicularly extending downward from two distal ends of the locking body 101. A connecting portion (not labeled) between the locking body 101 and a corresponding clip 100 is composed of two parallel triangular ribs 102 defining a receiving space 103 therebetween. Each clip 100 defines an upright slot 104 extending from a middle portion to a lower end thereof thereby separating a lower end of the clip 100 into two resilient arms 105. The resilient arms 105 further form two outwardly projecting barbs 106 at a free end thereof. A middle portion of each clip 100 further forms two opposite pressing portions 107 beside the slot 104 adapted to receive a clamping force to move the projecting barbs 106 toward each other.

The second locking portions 13 comprise two U-shaped guiding channels 130 extending upwardly from two lateral sides of the insulative housing 20 and beyond a top face of the insulative housing 20, and two pair of holes 131 (only one pair shown), each hole being located below a corresponding U-shaped guiding channel 130 and defined through a front or rear face (not labeled) of the insulative housing 20.

Figure 2:
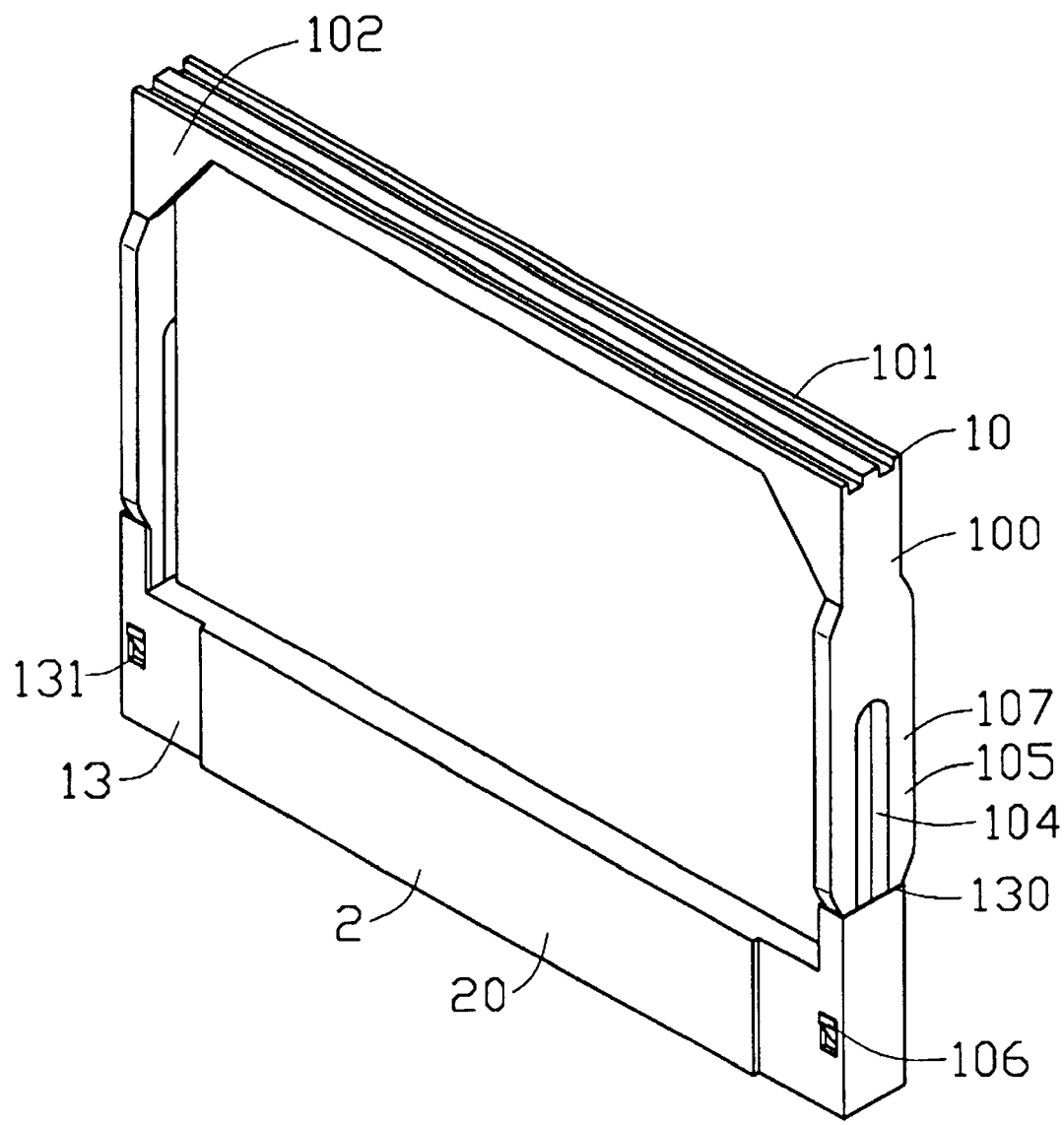
FIG. 2 is an assembled view of FIG. 1.

Also referring to FIG. 2, in use, the edge card 3 is inserted into the electrical connector 2 to reach a position in which golden fingers 31 on the lower edge 30 of the edge card 3 are electrically engaged with corresponding contacting portions 211 of the terminals 21. The pressing portions 107 of the first locking portion 10 are then pressed inwardly to actuate the resilient arms 105 to move toward each other so that they can be downwardly inserted into the guiding channels 130 into the electrical connector 2 to reach a position in which the barbs 106 align with the holes 131. Thus, inner faces (not labeled) of the locking body 101 and two clips 100 of the first locking portion 10 respectively engage with an upper edge and two lateral edges (not labeled) of the edge card 3. Two upper corners (not labeled) of the edge card 3 are securely received within the receiving spaces 103 of the first locking portion 10. The pressing portions 107 are then released to allow the barbs 106 to move outwardly to engage with the corresponding holes 131, thereby firmly securing the edge card 3 in the electrical connector 2. To release the edge card 3, a user inwardly presses the pressing portions 107 of the clips 100 so that the barbs 106 disengage from the holes 131, whereby the first locking portion 10 can be easily extracted upward from the second locking portions 13.

Figure 3:
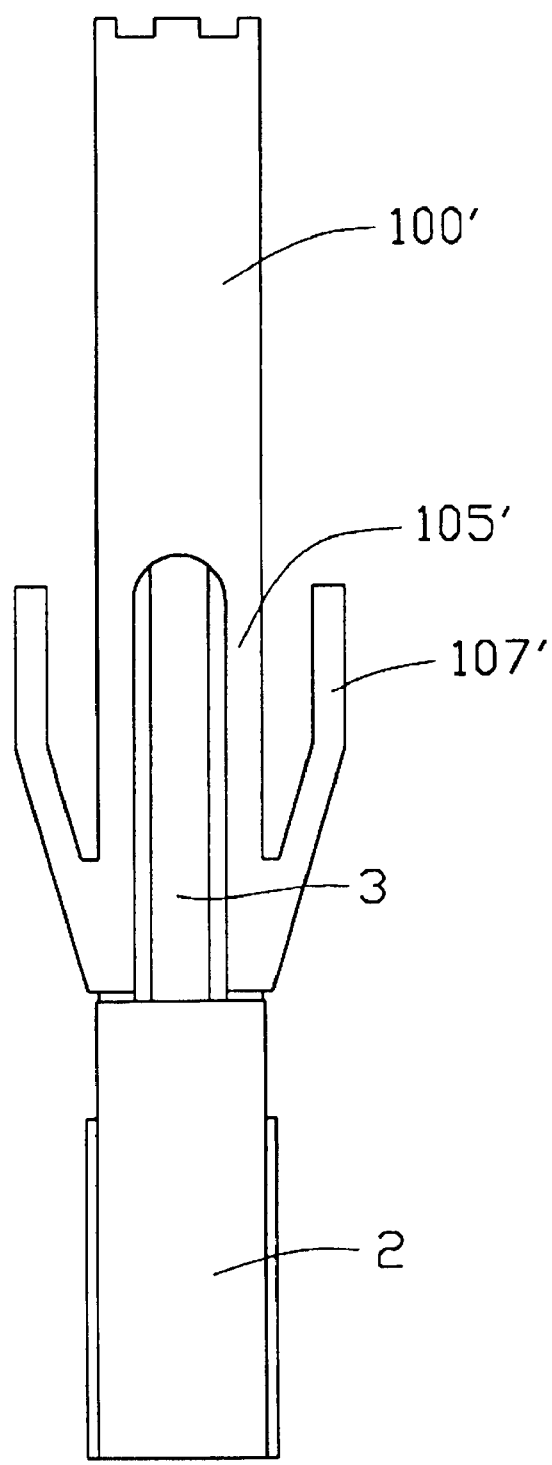
FIG. 3 is a side view of a second embodiment of the locking device of the present invention assembled with the edge card and the electrical connector.

FIG. 3 is a side view of a second embodiment of the present invention assembled with the edge card 3 and the electrical connector 2. The second embodiment is similar to the above-mentioned first embodiment, the difference therebetween being that pressing portions 107' are constructed in the shape of two resilient tabs projecting from corresponding resilient arms 105' of the clips 100'.

Figure 4:
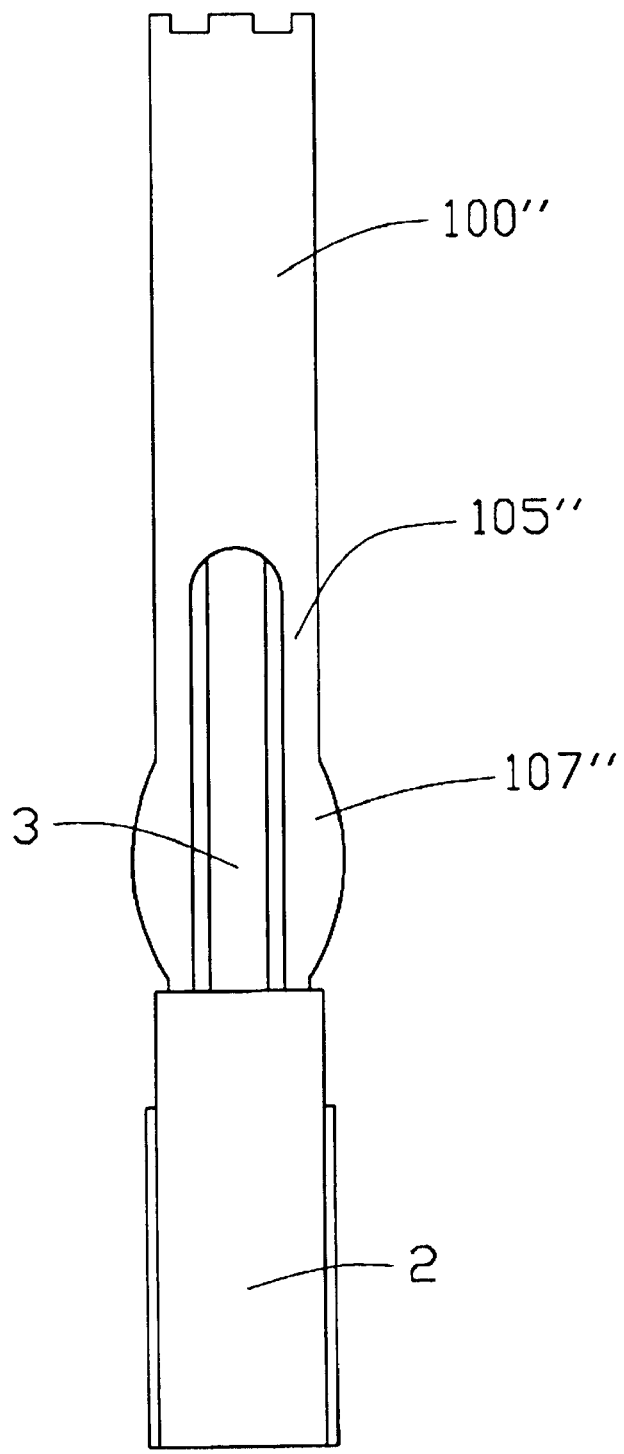
FIG. 4 is a side view of a third embodiment of the locking device of the present invention assembled with the edge card and the electrical connector.
Figure 5:
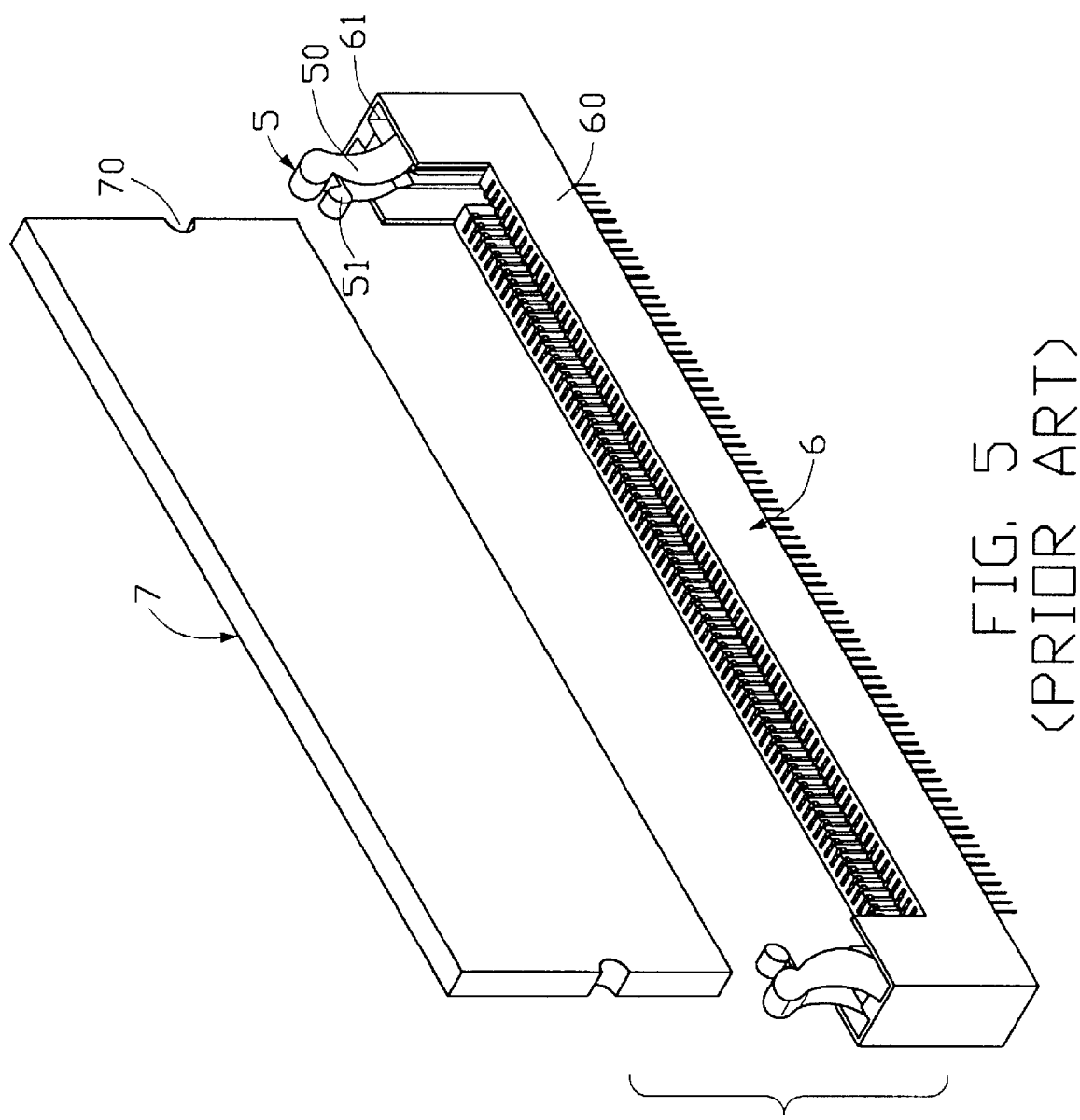
FIG. 5 is an exploded view of a prior art edge card electrical connector and an edge card to be mounted in the electrical connector.

FIG. 4 is a side view of a third embodiment of the present invention assembled with the edge card 3 and the electrical connector 2. The difference between the third embodiment and the first embodiment is that pressing portions 107" of third embodiment are configured as two arc portions 107" projecting from corresponding resilient arms 105" of the clips 100".

An advantage of the present invention is that the edge card 3 can be efficiently secured to the electrical connector 2 because the inner faces (not labeled) of the first locking portion 10 firmly engage with an upper edge and two lateral edges (not labeled) of the edge card 3.

A second advantage of the present invention is that the locking device 1 has decreased cost of manufacturing and assembly because of its relatively simple structure.

A third advantage is that the locking clip 101 extends downward with a significant distance generally equal to the height of the edge card 3, and the locking projection barbs 106 engaged within the corresponding locking holes 131 generally at the same level with the receiving slot 20 in the connector, so that the card 3 can be reliably and securely retained and fully surrounded by the combination of the connector 2 and the locking device 1. By the way, the pressing portion 107 of the clip 101 is positioned above both the connector 2 and the second locking portion 13 and inwardly deflectable in a transverse direction perpendicular to the lengthwise direction of the connector for easy actuation without interference with the components which are closely adjacent to the connector 2 on the same printed circuit board (not shown).

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A locking device for securing an edge card to an electrical connector in which the edge card has a lower edge to be inserted into the electrical connector to electrically connect therewith, the locking device comprising:

a first locking portion having an elongated locking body and two clips extending from opposite ends of the locking body, wherein each clip includes two resilient arms formed at a distal end thereof;

a pair of second locking portions formed on two opposite ends of the electrical connector;

wherein the resilient arms of the first locking portion are resiliently inserted into the second locking portions to make a secure connection therein, and upper and side edges of the edge card can securely engage the first locking portion, thereby securing the edge card to the electrical connector;

wherein a connecting portion is formed between the locking body and each clip and includes two parallel ribs forming a receiving space therebetween for receiving two upper corners of the edge card;

wherein each clip defines a slot extending from a free end to a middle portion of the clip thereby separating a lower portion of the clip into the two resilient arms;

wherein each clip of the first locking portion forms two oppositely directed barbs on the free ends of the arms and the second locking portions each include a pair of holes on each of opposite faces of the electrical connector corresponding to the barbs of the first locking portion for securing the barbs;

wherein each clip further has two oppositely directed pressing portions at the middle portion thereof for being pressed together to actuate the resilient arms to move inwardly.

* * * * *